United States Patent
Wuerstlein et al.

(10) Patent No.: US 8,635,809 B2
(45) Date of Patent: Jan. 28, 2014

(54) ANTI-TRAPPING DEVICE FOR A MOTOR VEHICLE

(75) Inventors: Holger Wuerstlein, Zeil am Main (DE); Thomas Weingaertner, Memmelsdorf (DE); Wolf-Christian Mueller, Coburg (DE)

(73) Assignee: Brose Fahrzeugteile GmbH & Co. Kommanditgesellschaft, Coburg (DE)

( * ) Notice: Subject to any disclaimer, the term of this patent is extended or adjusted under 35 U.S.C. 154(b) by 576 days.

(21) Appl. No.: 12/439,096

(22) PCT Filed: Jul. 28, 2007

(86) PCT No.: PCT/EP2007/006698
§ 371 (c)(1),
(2), (4) Date: Sep. 14, 2009

(87) PCT Pub. No.: WO2008/025423
PCT Pub. Date: Mar. 6, 2008

(65) Prior Publication Data
US 2010/0024301 A1   Feb. 4, 2010

(30) Foreign Application Priority Data
Aug. 30, 2006   (DE) .................. 20 2006 013 337 U

(51) Int. Cl.
*E05F 15/10*   (2006.01)

(52) U.S. Cl.
USPC .................. 49/26; 49/27; 49/28; 296/146.9; 296/216.06; 318/264; 318/265; 318/282; 318/466; 318/467; 318/468

(58) Field of Classification Search
USPC .................. 49/26–28, 339; 296/146.1–146.4, 296/146.9, 216.06–216.09, 223, 76; 318/264–266, 272, 275, 277, 282, 286, 318/466–468
See application file for complete search history.

(56) References Cited

U.S. PATENT DOCUMENTS

| 3,868,000 | A | * | 2/1975 | Spear et al. ................... 187/317 |
| 5,828,302 | A | * | 10/1998 | Tsutsumi et al. ............. 340/540 |
| 6,297,605 | B1 | * | 10/2001 | Butler et al. .................. 318/466 |
| 6,377,009 | B1 | * | 4/2002 | Philipp ......................... 318/468 |

(Continued)

FOREIGN PATENT DOCUMENTS

| EP | 1 154 110 A2 | 1/1997 |
| EP | 1 455 044 A2 | 9/2004 |
| WO | WO 97/01835 | 1/1997 |

*Primary Examiner* — Katherine Mitchell
*Assistant Examiner* — Marcus Menezes
(74) *Attorney, Agent, or Firm* — Muncy, Geissler, Olds & Lowe, PLLC

(57) ABSTRACT

The invention specifies an anti-trapping device, comprising a motor for driving a pivotable actuating element of a motor vehicle, a sensor for contactlessly identifying an obstacle in the way of the actuating element with an electrode, which has a plurality of segments for producing an external electrical field with respect to a mating electrode and a control unit. The electrode extends in a radial direction with respect to the pivotable actuating element and is split in the radial direction into the plurality of segments, which can each be evaluated separately for the purpose of generating an interference signal. The control unit is designed to drive the motor as a function of an interference signal from one of the segments. Such an anti-trapping device has particularly high flexibility when driving the pivotable actuating element if an obstacle in the way of the pivotable actuating element has been detected.

16 Claims, 2 Drawing Sheets

(56) References Cited

U.S. PATENT DOCUMENTS

| | | | |
|---|---|---|---|
| 6,411,054 B1 * | 6/2002 | Van Wiemeersch | 318/445 |
| 6,525,499 B2 * | 2/2003 | Naganuma | 318/445 |
| 6,676,186 B2 * | 1/2004 | Greif | 296/50 |
| 6,782,660 B2 * | 8/2004 | Takada et al. | 49/25 |
| 6,836,209 B2 * | 12/2004 | Ploucha | 340/435 |
| 7,000,352 B2 * | 2/2006 | Ishihara et al. | 49/28 |
| 8,049,451 B2 * | 11/2011 | Patterson et al. | 318/466 |
| 2003/0085679 A1 * | 5/2003 | Bledin et al. | 318/264 |
| 2004/0172879 A1 | 9/2004 | Regnet et al. | |
| 2005/0011129 A1 * | 1/2005 | Vassy | 49/339 |
| 2005/0137765 A1 * | 6/2005 | Hein et al. | 701/36 |
| 2005/0179409 A1 * | 8/2005 | Honma et al. | 318/62 |
| 2006/0117862 A1 | 6/2006 | Shank et al. | |
| 2007/0266635 A1 * | 11/2007 | Sugiura et al. | 49/27 |

* cited by examiner

ANTI-TRAPPING DEVICE FOR A MOTOR VEHICLE

This application is a national stage of International Application No.: PCT/EP2007/006698, which was filed on Jul. 28, 2007, and which claims priority to German Patent Application No.: 20 2006 013 337.2, which was filed in Germany on Aug. 30, 2006, and which are both herein incorporated by reference.

The invention relates to an anti-pinch device, comprising a motor for driving a pivotable actuating element of a motor vehicle, a sensor for the non-contact detection of an obstacle in the path of the actuating element, and a control unit.

To detect an obstacle, prior-art anti-pinch systems utilize in particular sensors made on the capacitive measuring principle. In this case, an electric field is created between a measuring electrode and a suitable counter electrode. If a dielectric, i.e., a foreign body, enters this electric field, the capacitance of the capacitor formed by the measuring electrode and the counter electrode changes. Theoretically, any obstacle, with a relative dielectric constant $\in_r$ different from the relative dielectric constant of air, in the path of an actuating element of a motor vehicle can be detected in this way. The obstacle in the path of an actuating element is detected without physical contact by the anti-pinch sensor. If a change in capacitance is detected, countermeasures, such as, for example, stopping or reversing of the drive of the actuating element, can be initiated in a timely fashion, before the actual pinching of the obstacle occurs.

Non-contact anti-pinch sensors, based on the capacitive measuring principle, are known, for example, from European Pat. Applications Nos. EP 1 455 044 A2 and EP 1 154 110 A2. Both sensors generate an external electric field by means of a measuring electrode and a suitable counter electrode, so that a dielectric entering this external electric field may be detected as a change in capacitance between the measuring electrode and counter electrode. To be able to assure high reliability in the detection of pinching, in both prior-art anti-pinch sensors the distance between the measuring electrode and counter electrode is designed in addition as changeable, as a result of which physical contact between an obstacle and the anti-pinch sensor can also be detected as a change in capacitance.

Disadvantageously, particularly in the case of a pivotable actuating element of a motor vehicle, such as, for example, an electrically actuatable trunk lid, an electrically actuatable engine hood, or an electrically actuatable vehicle door, the typically estimated reaction time between the occurrence of an interference signal and stopping of the movement of the actuating element due to the high speeds is not sufficient to reliably avoid a case of pinching in every case.

The object of the invention is to provide an anti-pinch device or anti-pinch system with the greatest reliability possible to avoid pinching, particularly in the case of a pivotable actuating element.

This object is achieved according to the invention by means of the combination of features in claim 1.

The invention in a first step proceeds from the consideration that when a pivotable actuating element closes, the speed increases with increasing radial distance to the axis of rotation. Consequently, during a closing process at a typically constant angular velocity, for an obstacle located near the axis in the path of travel of the actuating element, there is a greater time interval between the detection of the obstacle and the pinching of the obstacle than for an obstacle that is far from the axis in the path of travel. Because the obstacle is detected by the non-contact capacitive sensor upon entry into a detection space with a fixed spatial size, in the case of the obstacle far from the axis, the anti-pinch device therefore does not have a sufficient reaction time to avoid pinching.

In a second step, the invention recognizes that the reliability of avoiding pinching can be increased when a positional detection of a foreign body entering the path of a pivotable actuating element is made possible. In this case, namely the reaction time of the anti-pinch system can be adjusted to the radial distance of the obstacle to the axis of rotation, or to the different speeds. Specifically in the case of an obstacle far from the axis, the motor can be controlled accordingly so that the actuating element is slowed in a timely fashion before pinching occurs or is operated in the opening direction.

For detecting a position, the electrode of the sensor is divided into a plurality of segments, which can be evaluated as separate electrodes for generating an interference signal for capacitive non-contact detection of an obstacle. The capacitance of each electrode segment can therefore be measured individually relative to the counter electrode. Thus, the control unit is capable of assigning an interference signal, detected as a change in capacitance, to a segment; as a result, the position of the obstacle can be localized with sufficient resolution via the position of the segment depending on the number of segments.

The electrode extends in a radial direction relative to the pivotable actuating element. By virtue of this, it is possible to detect the radial distance of the obstacle from the axis of rotation by means of the segmentation, so that the driving of the motor corresponding to the established radial distance can be selected or predefined for timely slowing of the actuating element by the control unit.

A non-contact sensor designed in this way essentially allows the detection of a change in capacitance by means of a multiplex process. In this case, the individual segments can be controlled by means of separate lines either displaced in time (serially) or simultaneously (parallel). The first serial control offers the advantage that only a single evaluation circuit is necessary in this case for the capacitance change. Nevertheless, the time constant must be considered here until all segments have been connected through one after another. The second parallel control in fact does not have the disadvantageous time delay, but requires a plurality of evaluation electronics for evaluation, which increases the cost.

As a rule, the change in capacitance caused by a foreign body entering the path of an actuating element is small. This type of change in capacitance can be detected the better, however, the smaller the capacitance forming overall between the electrode and counter electrode. A special advantage of the segmented sensor therefore is that the capacitance formed between the electrode and the counter electrode can be reduced by using a sensor electrode that is divided into a plurality of segments; i.e., the detection sensitivity is high.

To set the reaction time of the anti-pinch system as a function of the radial distance of the obstacle, the control unit is set up to control the motor to drive the pivotable actuating element as a function of an interference signal from one of the segments. In this case, different procedures can be provided for stopping, pausing, or reversing the motor; depending on the position of the obstacle, these provide the greatest possible mechanically friendly operation of the motor at a high reliability against pinching.

According to a preferred embodiment, the control unit is set up to pause the motor more slowly at an interference signal generated by a first radially inner segment than at an interference signal from a second radially outer segment. The pausing in this case can be begun by the slowing or stopping of the motor. During a pivoting movement, the angular velocity for the actuating element is the same regardless of the radial distance. The radially inner region, however, has a lower speed than the radially outer region. Proceeding from this realization, the time until the motor and therefore the actuating element stop is set longer for an interference signal from the first segment, which is used to detect an obstacle in the path of a radially inner region of the actuating element, than for an interference signal from the second segment.

Preferably, the control unit is set up to reversibly control the motor to pause. As a result, rapid slowing is achieved. The actuating element also changes its direction within a short time after it halts, so that if necessary it releases the obstacle or foreign body if it comes in contact with the actuating element. This type of control of the motor offers a high operational reliability. Nevertheless, a reversing control opposite to the direction of motion results in increased stress on the motor, as well as on the transmission and drive train.

In an advantageous embodiment variant, the electrode has a first radially inner, a second radially central, and a third radially outer segment group. In this case, the actuating element is controlled accordingly depending on the segment group generating the interference signal. A segment group in this case comprises one or more adjacent segments; when there is an interference signal from the segment of a group, the control unit controls the motor or actuating element in approximately the same way.

Preferably, the control unit is set up to pause the motor initially gently when there is an interference signal from the first segment group. In particular, the motor is caused to run in the reverse direction only after stopping. Due to the radially inner position of the first segment group, the speed of the actuating element in the detection region of this segment group is lower than in the region of the two additional segment groups. Thus, a delay in the pausing process or a stepwise pausing or gentle slowing before the change in direction of the actuating element is possible; this makes little demand on the motor without the anti-pinching reliability being detrimentally affected.

The control unit is expediently set up to control the motor via PWM regulation, therefore via a pulse-width-modulated voltage or current signal. The PWM regulation enables in particular variation of the motor speed or angular velocity of the actuating element by changing the pulse duty factor, so that the gentle, gradual slowing of the motor when the first segment group detects a foreign body in the path of an actuating element can be performed without additional effort.

Preferably, the control unit is set up to shut off the motor immediately when there is an interference signal from the second segment group. Because the speed of the actuating element is greater in the central region of the actuating element than in the radially inner region, more rapid reaction to an obstacle is necessary, which is achieved by the immediate turning off of the motor. After the motor is turned off, because of intrinsic inertia and due to the system-inherent spring rates, the system will continue to run until the stored energy is used up. The motor can be run optionally in the reverse direction after stopping. Overall, a mechanically friendly operating mode again results.

The radially outer region of the actuating element has the highest speed and, to assure an anti-pinching-reliable operation of the actuating element, immediate anti-pinch measures are necessary if an obstacle is detected. Therefore, the control unit is set up preferably to run the motor immediately in the reverse direction when there is an interference signal from the third segment group.

According to a preferred embodiment of the anti-pinch device, it is provided that at least one of the segment groups is formed in such a way that when the motor is run a substantially continuous transition occurs within the segment group relative to the adjacent segments. A continuous transition when the motor is run occurs in particular when the segment group comprises many segments. In regard to the example of the first segment group, this means that a differently rapid slowing of the motor is brought about depending on the segment of this segment group, said segment that has generated the interference signal. The continuous transition can extend in addition across the segment groups.

Advantageously, the electrode is carried in a flexible carrier. This type of carrier permits adjustment of the anti-pinch sensor to the given contours of a motor vehicle. In particular, the sensor can be formed overall as a flexible flat cable. It can also be conceivable to design the sensor as a sealing body or to integrate the sensor into a sealing body. The sealing body is provided thereby to seal the actuating element relative to the closing edge in a closed state.

A flexible flat cable is also called an FFC and is notable in that parallel conductor structures are placed in a flexible cable body. As an alternative to an FFC, a flexible conductor structure may also be used. A flexible conductor structure is also known under the term FPC (flexible printed circuit). In this case, traces are specifically arranged or laid out in a flexible insulating material, particularly in a multilayer arrangement. This type of design permits high flexibility with respect to the dimensioning and arrangement of the individual traces.

It is advantageous, furthermore, if a shielding electrode is provided in addition in the flexible carrier to direct the electric field into a hazard region. The electrode and the shielding electrode are arranged substantially opposite and isolated from one another. In this case, the shielding electrode is at the same potential as the electrode. If this type of shielding electrode is inserted between the electrode and counter electrode, the electrical field forming between the electrode and shielding electrode and thereby a direct capacitance are considerably reduced. According to this design, an electric field, directed far into the space, forms like a stray-field capacitor between the electrode and the counter electrode. The detection space or the range of the sensor is considerably increased as a result.

Expediently, the shielding electrode is also divided into electrically contacted shielding segments, between which separate lines are arranged in an isolated manner. In this way, it is reliably avoided that a capacitance is formed between the lines and the counter electrode. Each line is shielded from the counter electrode in this manner.

Advantageously, furthermore, switching means are provided for potential equalization between the electrode and the shielding electrode. This achieves that no electric field forms between the electrode and shielding electrode.

For the potential equalization, an amplifier is expediently provided that is connected on the input side by means of a signal line to the electrode and on the output side to the shielding electrode to supply a signal derived from the signal line. As a result, it is achieved in a simple manner that the shielding electrode is always at the same potential as the electrode. A change in capacitance due to potential variations between the electrode and shielding electrode is hereby reliably avoided. It is especially advantageous in this case to control the shielding electrode in a low-impedance manner.

According to a preferred variant, the anti-pinch device comprises in addition a tactile sensor. The tactile sensor is provided as a type of backup sensor, which is to detect an obstacle also in the case of a perturbation function of the non-contact sensor. The tactile sensor can also be built based on a capacitive measuring principle. Here, upon contact, for example, based on a force or pressure effect caused by the contact, it shows a change in capacitance which is detected and evaluated by the control unit. The tactile sensor is also divided in particular, like the non-contact sensor, into different segments or segment groups.

According to another preferred variant, which is notable for a low space requirement, the non-contact sensor is designed simultaneously as a tactile sensor. This type of combination non-contact and tactile sensor can be made by providing a ground electrode and an internal electrode, in addition to the electrode, the counter electrode, and the shielding electrode; here, the shielding electrode and the internal electrode are separated from one another by the ground electrode, connected to the ground potential. At least the ground electrode and internal electrode are embedded in an electrically insulating, elastic material. The unit, comprising the ground electrode, the internal electrode, and the elastic material arranged between the electrodes, forms a tactile capacitive sensor. Hereby, the capacitance formed between the internal electrode and the ground electrode is used for the tactile detection of an obstacle. If there is a force effect on the sensor by an external obstacle, the elastic material is compressed and its thickness changes. Thus, the distance between the internal electrode and ground electrode changes, which results in a detectable change in capacitance of the tactile capacitive sensor. Thus, contact of the sensor by the obstacle is detected.

If the non-contact detection fails, detection of an obstacle still occurs as a result of the detection of the mechanical effect on the sensor, as a result of which the capacitance formed between the internal and shielding electrode changes.

The sensor can be used in a simple manner to detect an obstacle in the path of an actuating element of a motor vehicle, when the grounded body of the motor vehicle serves as the counter electrode. To this end, the described sensor is run along the contours of the motor vehicle in such a way that the shielding electrode comes to lie between the car body and the electrode. The evaluation circuit in this case detects the capacitance formed between the electrode and the grounded car body. The sensor is preferably arranged on a movable part of the actuating element, for example, on the trunk lid of the motor vehicle, but it can also be arranged on a body region opposite the trunk lid.

Exemplary embodiments of the invention are explained in greater detail with use of a drawing. Here, the figures show:

Figure 3:
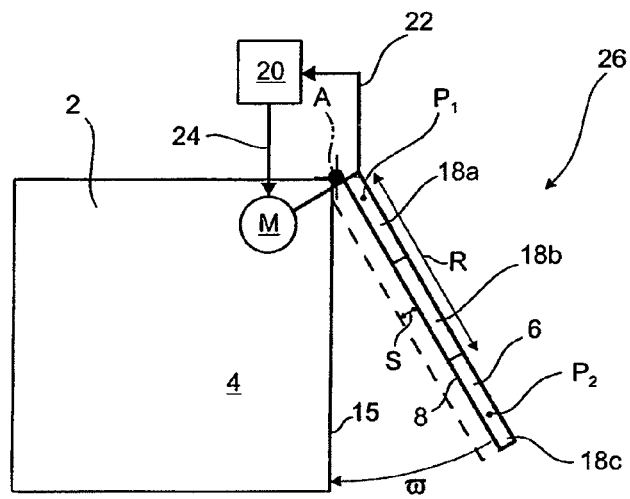
Figure 4:
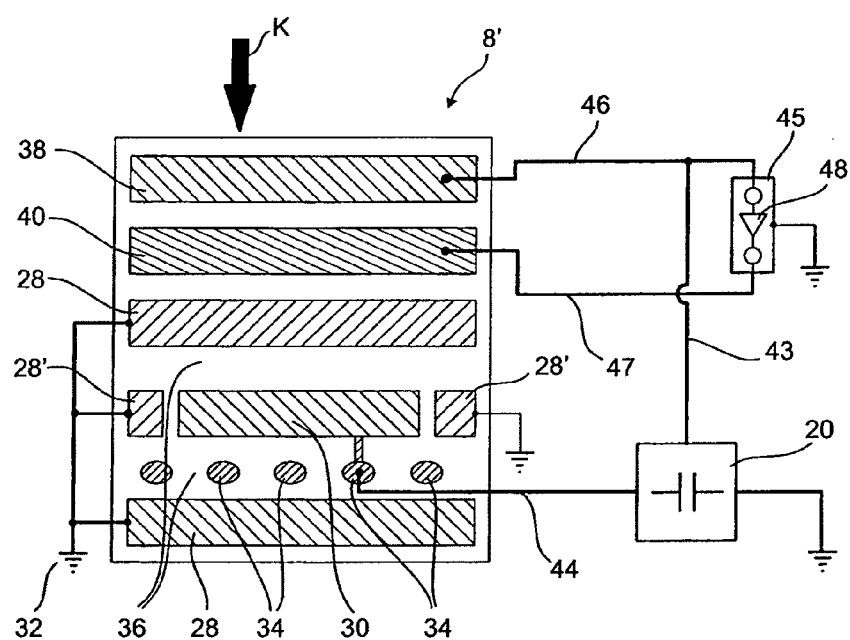

FIG. 3 in a highly simplified diagram shows a side view of a trunk lid of a motor vehicle; and FIG. 4 shows in a cross-section a combination non-contact and tactile capacitive sensor.

The same reference parts have the same meaning in the various figures.

Figure 1:
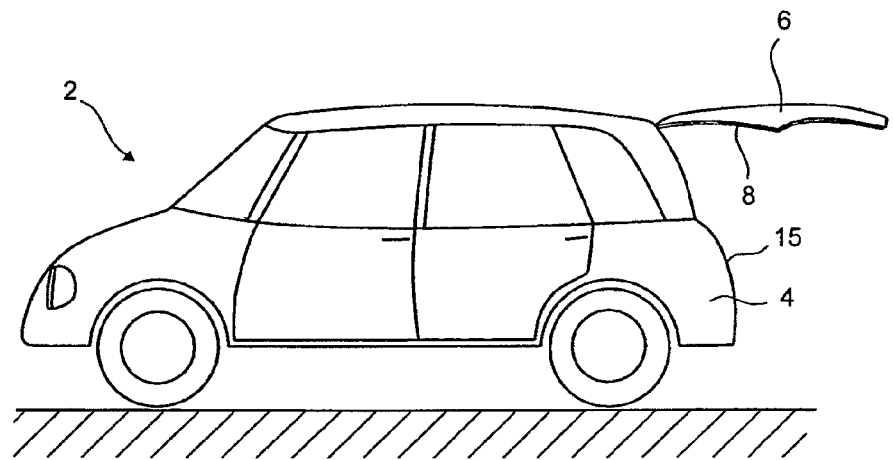
FIG. 1 shows schematically a side view of a motor vehicle.

FIG. 1 shows schematically a side view of a motor vehicle 2 with a body 4 and an open trunk lid 6. Trunk lid 6 represents a pivotable actuating element, which is driven electrically by a motor M (see FIG. 3). During closing of trunk lid 6, it must be assured that there is no obstacle within its area of motion, also called the hazard region hereinafter. For this purpose, a sensor 8 formed in particular as a flat cable is affixed along the side edges and along a lower rim of trunk lid 6. A plurality of segments (not shown here) of an electrode 14 (see FIG. 2), which have separate lines for control, are located in sensor 8. The grounded body 4 of the motor vehicle 2 serves as a counter electrode 15.

Figure 2:
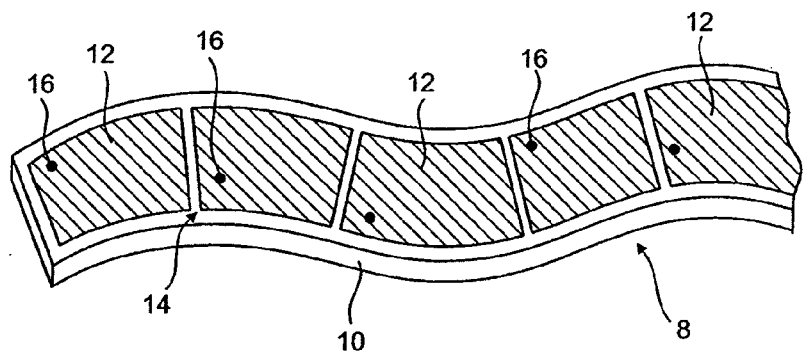
FIG. 2 shows in a plan view a sensor realized by a flexible conductor structure.

In FIG. 2 sensor 8 is shown in a plan view. The flexible conductor structure 10 is evident here, which can be easily run along a contour of motor vehicle 2. To clarify the structure, the insulation material on the top side of sensor 8 has been removed or not drawn. For this reason, individual segments 12 of electrode 14, said segments which are interrupted in the longitudinal direction of flexible conductor structure 10, are clearly visible. Each of these segments 12 has a through-hole plating 16, connected to a separate line. A multiplex process can be used in this way to evaluate sensor 8. Segments 12 are controlled individually one after another, offset in time, and the capacitance formed as a result is detected. Due to the reduced area of segments 12 compared with a continuous trace, the capacitance between segments 12 and counter electrode 15 is further reduced. This permits a further increase in the detection sensitivity.

The movement of trunk lid 6 during closing is shown in FIG. 3 in a highly simplified drawing of motor vehicle 2. Trunk lid 6 is arranged pivotably around an axis A on car body 4, said axis A which runs perpendicular to the plane of the drawing and is designated by point A. Trunk lid 6 extends from point A in a radial direction R.

During closing, trunk lid 6 moves toward body 4 at an average angular velocity $\bar{\omega}$, which applies to all radial regions of trunk lid 6. When the correlation between the speed u and the angular velocity $\bar{\omega}$ of an object $$u=\bar{\omega}*r$$

is considered, it turns out that different points of trunk lid 6, which have a different radial distance r from the axis of rotation A, move at different speeds toward car body 4. If, e.g., a point $P_1$, positioned radially inward, and a point $P_2$, positioned radially outward, are selected, then point $P_1$ moves more slowly in the direction of car body 4 than point $P_2$. In other words, points far from the axis have a higher speed than points close to the axis.

This realization is used in controlling trunk lid 6. Here, sensor 8 is divided into different segment groups 18a, 18b, 18c in radial direction R, or the individual segments 12 are grouped in segment groups 18a, 18b, 18c. Each segment 12 within the segment groups 18a, 18b, 18c supplies a measuring signal, in the present case a capacitance signal, to a control unit 20 via a signal line 22 optionally by means of suitable evaluation electronics. Control unit 20 evaluates this signal in regard to a change in capacitance and depending on which segment 12 has detected an obstacle in the hazard region, it controls accordingly the motor M, which drives trunk lid 6, via control line 24. Control unit 20 is shown schematically in FIG. 3 outside car body 4. It may also be integrated, however, into door electronics or into the control electronics of motor vehicle 2. Sensor 8, control unit 20, and motor M together form an anti-pinch device 26 for detecting an obstacle in the path of trunk lid 6.

Segments 12 in this exemplary embodiment each have a detection region, which has an extension S in front of sensor 8 in the direction toward counter electrode 15. The detection region has the same extension for all segments 12.

If an obstacle enters the detection region of one of the segments 12, the detected capacitance for this segment 12 changes. Control unit 20 evaluates this change in capacitance as an interference signal. Control unit 20 is set up in such a way that it controls motor M in a different way for interference signals from the different segment groups 18a, 18b, 18c. Thus, e.g., in this exemplary embodiment, control unit 20 is formed to slow down motor M slowly at an interference signal from one or more segments 12 of the first, radially inner segment group 18a, particularly via PWM regulation, then to switch off the current, and finally to gently cause it to run in the reverse direction (to open trunk lid 6). This mechanically friendly operation of motor M is possible because of the slow speed at which the radially inner region of trunk lid 6, on which first second group 18*a* is arranged, moves during closing of trunk lid 6 toward car body 4.

If the interference signal was generated from the second, central segment group 18*b*, the reaction time of the system must be shorter, because the corresponding radially central region of trunk lid 6 moves more rapidly than the radially inner region. Thus, control unit 20 turns off motor M immediately, and after a short shutdown period, during which the drive can wind down, it drives the motor M in the reverse direction.

When an obstacle is detected in the detection region of the third, radially outer segment group 18*c*, motor M is immediately driven in the reverse direction. This is necessary, because the corresponding outer region of trunk lid 6 moves at a higher speed than the other regions and there is less time to react before pinching of the obstacle.

The structure of an exemplary sensor 8', which is made as a multisensor for non-contact and tactile detection of an obstacle, is shown in FIG. 4. Sensor 8' is based in particular on the capacitive measuring principle. Sensor 8' shown in FIG. 4 comprises first a basic structure comprising two outer ground electrodes 28 and a flat internal electrode 30 between the ground electrodes 28. Two flat conductors 28', which are contacted electrically in each case with ground electrodes 28, are arranged in turn on the narrow sides of internal electrode 30. The ground electrode 28, 28' formed overall as a result is connected to ground potential 32, particularly to ground. In the longitudinal direction of the flat cable, internal electrode 30 is divided into a plurality of segments isolated from one another. One of these segments is included in the shown section. Each of these segments has a separate line 34, by which in each case the capacitance between the segment and internal electrode 30 and ground electrode 28 can be measured or evaluated. The separate lines 34 in this case are arranged within an insulating and elastic material 36 separating ground electrode 28 and internal electrode 30.

The basic unit comprising ground electrode 28, 28', internal electrode 30, lines 34, and the layer arranged between the electrodes and made of elastic material 36 acts as a tactile capacitive sensor. To determine the capacitance between ground electrodes 28, 28' and internal electrode 30, ground electrode 28 is connected to a ground potential, particularly to ground, and internal electrode 30, on the contrary, is supplied with an alternating voltage. The forming capacitance can be easily measured herewith using a suitable evaluation circuit.

If a force effect on sensor 8' by an external object occurs in the direction of the shown force vector K, this results in a compression of the layers of elastic material 36. The thickness of elastic material 36 therefore changes. Because the capacitance of the capacitor comprising ground electrode 28 and internal electrode 30 depends on their distance and therefore on the thickness of the insulating material 36, the shown force effect leads to a change in the capacitance, so that it is possible to detect contact with sensor 8'. In this case, a locally limited force in sensor 8' extending as a flat cable is sufficient to cause a detectable change in capacitance.

To evaluate sensor 8' as a tactile sensor, the segments of internal electrode 30 are connected via their separate lines 34 by means of a connecting line 44 to control unit 20. In this case, control unit 20 records a change in capacitance between ground electrode 28 and the particular segment of internal electrode 30. If the distance between the top and bottom ground electrode 28 and internal electrode 30 changes, a change in capacitance results, which indicates a force or pressure effect at the site of the evaluated segment. A position resolution of the tactile capacitive sensor 8' can be achieved therefore by a serial evaluation of the segments of internal electrode 30.

In addition, according to FIG. 4, sensor 8' comprises electrode 38, which is again formed as a flat conductor and is arranged opposite to top ground electrode 28. A shielding electrode 40, also formed as a flat conductor, is arranged between electrode 38 and top ground electrode 28. Electrodes 38 and 40 are embedded in isolating material 36. The structural unit, consisting of top ground electrode 28, shielding electrode 40, and electrode 38 operates as a non-contact proximity sensor based on the capacitive measuring principle, which will be described hereinafter.

To utilize sensor 8' as a non-contact proximity sensor, electrode 38 is supplied with an alternating voltage by means of signal line 46. The alternating voltage in this case is generated by signal generator 45 relative to the ground potential. Further, shielding electrode 40 is supplied with an alternating voltage, which is derived from the alternating voltage fed to electrode 38, by means of connecting line 47. For this purpose, switching means 48, formed as an operational amplifier, are used between signal line 46 and connecting line 47. It is assured in this way that electrode 38 and shielding electrode 40 are at the same potential without a time delay.

As the result of electrode 38 and shielding electrode 40 being at the same potential, no direct capacitance forms between electrode 38 and top ground electrode 28. It is formed directly by shielding electrode 40 and top ground electrode 28. Instead, an electric field extending far into the space arises between the edges of electrode 38 and the ground of ground electrode 28 and particularly a body of the motor vehicle at ground, as a result of which a large space for the detection of obstacles is available. In this case, the capacitance formed by electrode 38 and ground due to the shielding effect by shielding electrode 40 is clearly reduced compared with a direct capacitance. To measure the capacitance change during entry of an obstacle, control unit 20 is connected to electrode 38 by a connecting line 43. Control unit 20 detects hereby the ratio of the capacitance change $\Delta C$ to capacitance C. To detect the capacitance either a measuring bridge may be used or the charge constant can be monitored.

Sensor 8' shown in FIG. 4 therefore is a multisensor, which combines the functions of a tactile capacitive and a non-contact capacitive sensor. Sensor 8' therefore offers high safeguarding against failure and is particularly suitable for the reliable detection of an obstacle in the closing path of an actuating element 6 of a motor vehicle 2.

LIST OF REFERENCE CHARACTERS

| List of Reference Characters | |
|---|---|
| 2 | motor vehicle |
| 4 | car body |
| 6 | trunk lid |
| 8 | non-contact sensor |
| 8' | non-contact and tactile sensor |
| 10 | flexible conductor structure |
| 12 | segment |
| 14 | electrode |
| 15 | counter electrode |
| 16 | through-hole plating |
| 18a, 18b, 18c | segment groups |
| 20 | control unit |
| 22 | signal line |

-continued

List of Reference Characters

| | |
|---|---|
| 24 | control unit |
| 26 | anti-pinch device |
| 28, 28' | ground electrode |
| 30 | internal electrode |
| 32 | ground potential |
| 34 | line |
| 36 | material |
| 38 | electrode |
| 40 | shielding electrode |
| 44 | connecting line |
| 45 | signal generator |
| 46 | signal line |
| 47 | connecting line |
| 48 | switching means |
| A | axis of rotation |
| K | force vector |
| M | motor |
| $P_1, P_2$ | points |
| R | radial direction |
| [r] | radial distance |
| S | detection distance |
| [u] | speed |
| ω | angular velocity |

The invention claimed is:

1. An anti-pinch device, comprising:
a motor driving a pivotable actuating element of a motor vehicle about an axis of rotation;
a non-contact detection sensor which detects obstacles in a path of the actuating element with an electrode that generates an external electric field relative to a counter electrode, the electrode extending in a radial direction relative to the axis of rotation of the pivotable actuating element and being divided in the radial direction into a plurality of segments that are arranged successively further from the axis of rotation, each of which being evaluated separately and generates an interference signal; and
a control unit which controls the motor depending on an interference signal from one of the segments, wherein the control unit further controls the motor differently depending on which one of the segments the interference signal is received from, wherein the control unit further controls the motor differently depending on the distance of the segment from which the interference signal is received to the axis of rotation of the pivotable actuating element.

2. The anti-pinch device according to claim 1, wherein the control unit is configured to bring the motor to a pause more slowly for an interference signal generated by a first radially inner segment than for an interference signal from a second radially outer segment.

3. The anti-pinch device according to claim 2, wherein the control unit is set up to reverse a direction of the motor to bring the motor to a pause.

4. The anti-pinch device according to claim 1, wherein the electrode has a first radially inner, a second radially central, and a third radially outer segment group.

5. The anti-pinch device according to claim 4, wherein the control unit is configured to more gently pause or slow the motor without reversing its direction when there is an interference signal from the first segment group, as compared to when there is an interference signal from the second or third segment groups.

6. The anti-pinch device according to claim 5, wherein the control unit is configured to control the motor via a pulse-width-modulation (PWM) regulation.

7. The anti-pinch device according to claim 4, wherein the control unit is configured to shut off the motor immediately when there is an interference signal from the second segment group.

8. The anti-pinch device according to claim 4, wherein the control unit is configured to run the motor immediately in a reverse direction when there is an interference signal from the third segment group.

9. The anti-pinch device according to claim 4, wherein at least one of the segment groups is configured such that when the motor is run, a substantially continuous transition in how the motor is controlled occurs within the segment group relative to the adjacent segments.

10. The anti-pinch device according to claim 1, wherein the electrode is carried in a flexible carrier.

11. The anti-pinch device according to claim 10, wherein a shielding electrode is provided in addition in the flexible carrier to direct the electric field into a hazard region.

12. The anti-pinch device according to claim 11, wherein a switch is provided for potential equalization between the electrode and the shielding electrode.

13. The anti-pinch device according to claim 11, wherein an amplifier is provide for potential equalization and is connected on an to the shielding electrode to supply a signal derived from the signal line.

14. The anti-pinch device according to claim 13, further comprising a tactile sensor.

15. The anti-pinch device according to claim 11, wherein the shielding electrode is divided into electrically contacted shielding segments, between which separate lines are arranged in an isolated manner.

16. The anti-pinch device according to claim 1, wherein a grounded body of the motor vehicle serves as the counter electrode.

* * * * *